United States Patent
Hwang

(10) Patent No.: US 12,340,831 B2
(45) Date of Patent: Jun. 24, 2025

(54) MEMORY DEVICE INCLUDING THREE-DIMENSIONAL RACETRACK AND OPERATING METHOD THEREOF

(71) Applicant: Samsung Electronics Co., Ltd., Suwon-si (KR)

(72) Inventor: Youngnam Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 18/225,908

(22) Filed: Jul. 25, 2023

(65) Prior Publication Data

US 2024/0079040 A1 Mar. 7, 2024

(30) Foreign Application Priority Data

Sep. 5, 2022 (KR) .................. 10-2022-0112340
Nov. 11, 2022 (KR) .................. 10-2022-0150973

(51) Int. Cl.
*G11C 11/16* (2006.01)

(52) U.S. Cl.
CPC ........ *G11C 11/1655* (2013.01); *G11C 11/161* (2013.01); *G11C 11/1657* (2013.01)

(58) Field of Classification Search
CPC .............. G11C 11/1655; G11C 11/161; G11C 11/1657; G11C 11/1673; G11C 11/1675
USPC ........................................ 365/189.05, 230.06
See application file for complete search history.

(56) References Cited

U.S. PATENT DOCUMENTS

| | | | | |
|---|---|---|---|---|
| 6,920,062 B2* | 7/2005 | Parkin | ................ | G11C 19/0841 |
| | | | | 365/158 |
| 7,031,178 B2* | 4/2006 | Parkin | ................ | G11C 11/1673 |
| | | | | 365/83 |
| 7,539,051 B2* | 5/2009 | Deligianni | .......... | G11C 11/1675 |
| | | | | 977/933 |
| 7,961,491 B2* | 6/2011 | Lee | ......................... | G11C 11/14 |
| | | | | 977/935 |
| 8,089,797 B2 | 1/2012 | Kim et al. | | |
| 8,228,706 B2* | 7/2012 | DeBrosse | ........... | G11C 11/1673 |
| | | | | 365/158 |
| 8,331,125 B2 | 12/2012 | DeBrosse | | |
| 9,142,759 B2* | 9/2015 | Morise | ................... | H10N 50/85 |

(Continued)

FOREIGN PATENT DOCUMENTS

JP   2007-073103 A   3/2007
JP   2007-273064 A   10/2007

(Continued)

OTHER PUBLICATIONS

Isabelle Dume, "Racetrack memory nears the finish line", Physics World, Magnetism and Spin, Research Update, Jan. 10, 2011, 3 pages, url: https://physicsworld.com/a/racetrack-memory-nears-the-finish-line/.

(Continued)

*Primary Examiner* — Michael T Tran
(74) *Attorney, Agent, or Firm* — Sughrue Mion, PLLC

(57) ABSTRACT

A memory device including a three-dimensional racetrack and an operating method of the memory device are provided. The memory device includes a first racetrack, a first transistor, a first domain index controller, a bit line driver, a plurality of first magnetic tunnel junction (MTJ) elements, a plurality of first cell transistors, and a source line driver.

20 Claims, 14 Drawing Sheets

(56) References Cited

U.S. PATENT DOCUMENTS

| | | |
|---|---|---|
| 10,614,902 B1 | 4/2020 | Zingsem et al. |
| 11,151,439 B2 | 10/2021 | Ouyang et al. |
| 2012/0250398 A1* | 10/2012 | Morise .................. G11C 11/14 365/171 |

FOREIGN PATENT DOCUMENTS

| | | |
|---|---|---|
| KR | 10-0846504 B1 | 7/2008 |
| KR | 10-1336990 B1 | 12/2013 |

OTHER PUBLICATIONS

A. Manchon et al., "Current-induced spin-orbit torques in ferromagnetic and antiferromagnetic systems", Review of Modern Physics, vol. 91, Issue 3, Jan. 29, 2018, 72 pages, arXiv:1801.09636v1.

* cited by examiner

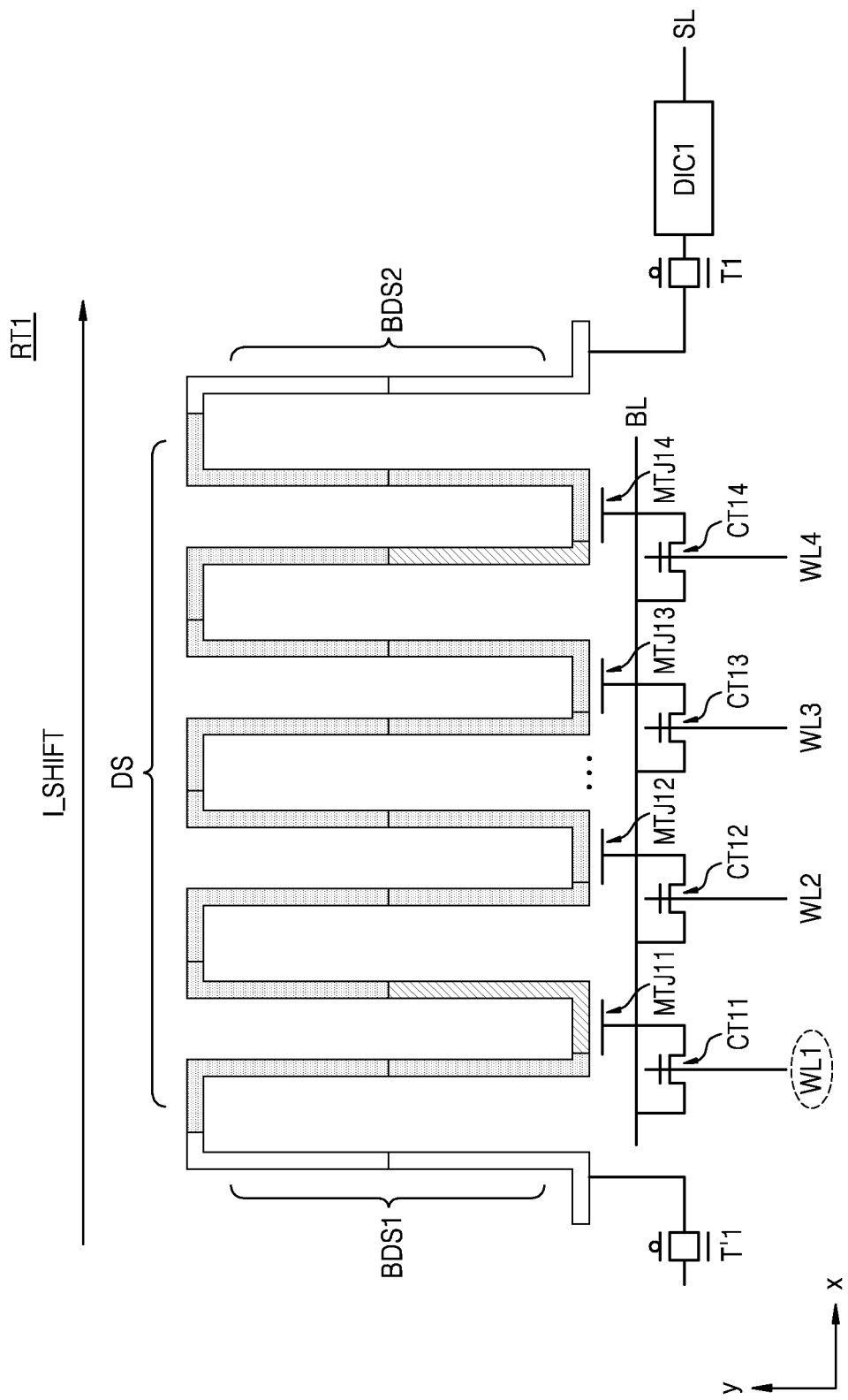

MEMORY DEVICE INCLUDING THREE-DIMENSIONAL RACETRACK AND OPERATING METHOD THEREOF

CROSS-REFERENCE TO RELATED APPLICATIONS

This application is based on and claims priority under 35 U.S.C. § 119 to Korean Patent Application No. 10-2022-0112340, filed on Sep. 5, 2022, and Korean Patent Application No. 10-2022-0150973, filed on Nov. 11, 2022, in the Korean Intellectual Property Office, the disclosures of which are incorporated by reference herein in their entirety.

BACKGROUND

1. Field

One or more embodiments of the disclosure relates to a memory device and an operating method of the memory device.

2. Description of Related Art

Racetrack magnetic memory may include a racetrack including a series of domains having states according to data stored in the domains and may perform a read or write operation of the data stored in the domains by shifting the domains according to current flowing in the racetrack.

Therefore, a method of efficiently reading or writing data stored in domains is desired.

SUMMARY

One or more embodiments of the disclosure provides a memory device for reducing a buffer area of a three-dimensional (3D) racetrack magnetic memory and an operating method of the memory device.

One or more embodiments of the disclosure provides a memory device for reducing a domain shift time, a read or write time, and power consumption by controlling a plurality of racetrack magnetic memories with a single domain controller and an operating method of the memory device.

According to an aspect of the disclosure, there is provided a memory device including: a first racetrack formed in a first direction, the first racetrack including a domain section including a plurality of first domains arranged in a second direction that is perpendicular to the first direction, a first transistor connected to the first racetrack, a first domain index controller connected to the first transistor and configured to shift first data from a first domain to a second domain, among the plurality of first domains of the first racetrack, a bit line driver connected to the first domain index controller, a plurality of first magnetic tunnel junction (MTJ) elements arranged in the first direction and adjacent to the first racetrack, a plurality of first cell transistors respectively connected to the plurality of first MTJ elements and a source line driver connected to the plurality of first cell transistors through a source line.

According to another aspect of the disclosure, there is provided a memory device including: a racetrack formed in a first direction, the racetrack including a domain section including a plurality of domains arranged in a second direction that is perpendicular to the first direction; a first transistor connected to the racetrack; a domain index controller connected to the first transistor and configured to shift first data from a first domain to a second domain, among the plurality of domains of the racetrack; a source line driver connected to the domain index controller; a plurality of magnetic tunnel junction (MTJ) elements arranged in the first direction and adjacent to the racetrack; a plurality of cell transistors respectively connected to the plurality of MTJ elements; and a bit line driver connected to the plurality of cell transistors through a bit line.

According to another aspect of the disclosure, there is provided an operating method of a memory device, the operating method including: shifting first data from a first domain to a second domain, among a plurality of domains in a racetrack, based on a first address signal; selecting one of a plurality of magnetic tunnel junction (MTJ) elements adjacent to the racetrack, based on a second address signal; and performing a read operation or a write operation based on a current that has passed through the racetrack and the selected MTJ elements.

BRIEF DESCRIPTION OF DRAWINGS

Embodiments will be more clearly understood from the following detailed description taken in conjunction with the accompanying drawings in which:

FIG. 8C is a diagram illustrating a racetrack when a word line is activated and a read or write operation is performed, according to another embodiment;

DETAILED DESCRIPTION

Hereinafter, embodiments are described in detail with reference to the accompanying drawings.

The various features and advantageous details thereof are explained more fully with reference to the non-limiting example embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

Figure 1:
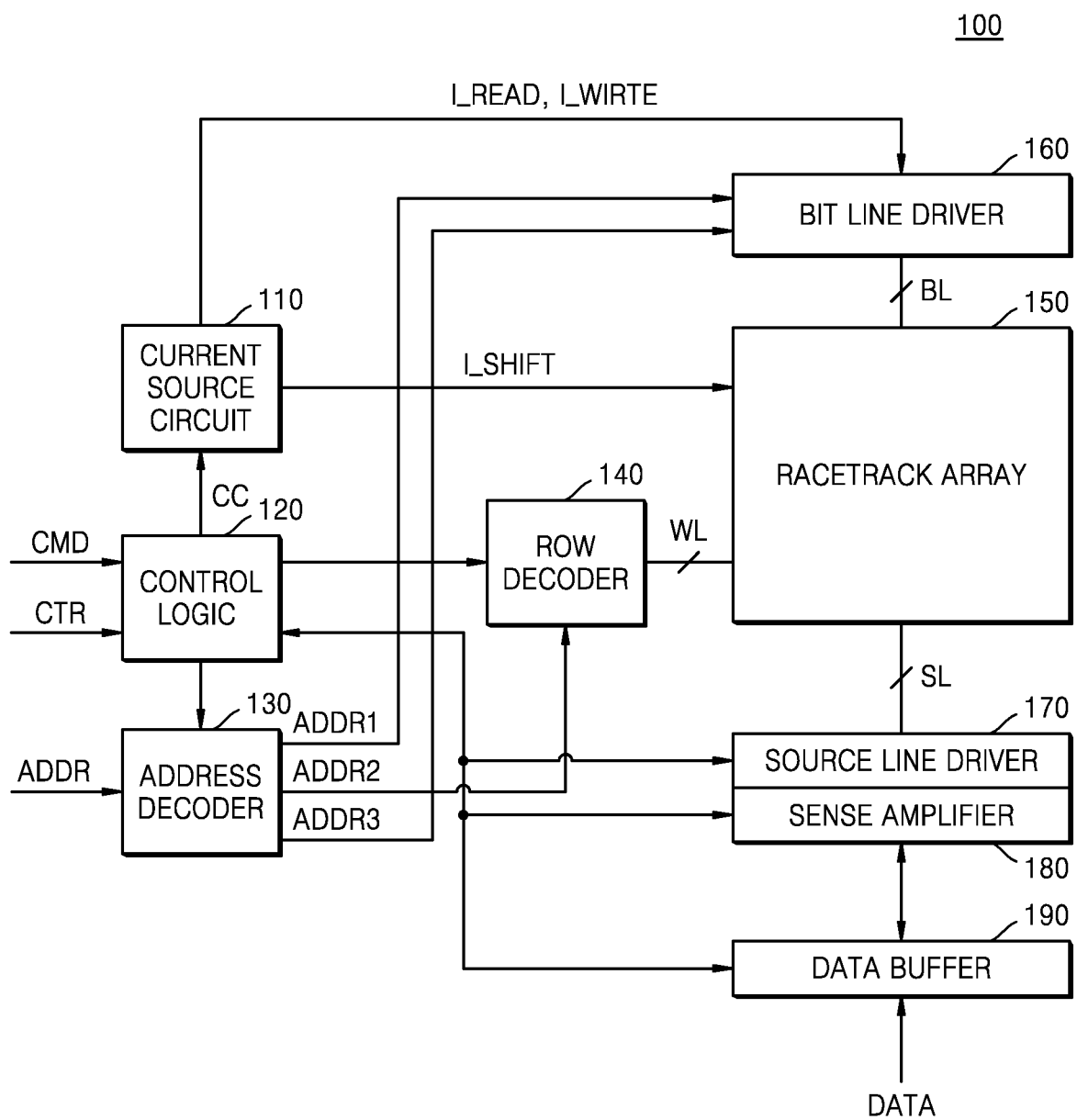
FIG. 1 is a block diagram of a memory device according to an embodiment.

FIG. 1 is a block diagram of a memory device according to an embodiment.

Referring to FIG. 1, a memory device 100 may include a current source circuit 110, a control logic 120, an address decoder 130, a row decoder 140, a racetrack array 150, a bit line driver 160, a source line driver 170, a sense amplifier 180, and a data buffer 190. The configuration of the memory device 100 in FIG. 1 is illustrated according to an example. However, the disclosure is not limited thereto, and as such, according to another example embodiment, some components may be omitted or a new component may be added. For example, according to a specific purpose, the agreement of the memory device may be modified without departing from the inventive concept of the disclosure.

The current source circuit 110 may provide a read current I_READ or a write current I_WRITE to the bit line driver 160. The current source circuit 110 may provide a shift current I_SHIFT to the racetrack array 150 to shift domains. The current source circuit 110 may include a voltage source circuit, which may provide a read voltage and a write voltage to the bit line driver 160.

The control logic 120 may generally control operations of the memory device 100. For example, the control logic 120 may control the address decoder 130, the row decoder 140, the bit line driver 160, the source line driver 170, the sense amplifier 180, and/or other components of the memory device. In particular, the control logic 120 may transmit a current control command CC to the current source circuit 110 to control a magnitude of the shift current I_SHIFT provided from the current source circuit 110 to the racetrack array 150, a magnitude of the read current I_READ and a magnitude of a write current I_WRITE provided from the current source circuit 110 to the bit line driver 160. Moreover, the control logic 120 may transmit the current control command CC to the current source circuit 110 to control the direction of the shift current I_SHIFT, the read current I_READ, or the write current I_WRITE. The control logic 120 may operate based on one of a command signal CMD and a control signal CTR, which are received from the outside of the memory device 100. For example, the control logic 120 may operate in response to one of a command signal CMD and a control signal CTR, or a combination of the command signal CMD and the control signal CTR.

The address decoder 130 may receive an address ADDR and output a first address ADDR1, a second address ADDR2, and a third address ADDR3. The first address ADDR1 may be used to shift domains of the racetrack array 150. The second address ADDR2 may be transmitted to the row decoder 140. The row decoder 140 may decode the second address ADDR2. The third address ADDR3 may be used to select at least one of a plurality of domain index controllers.

The row decoder 140 may receive the second address ADDR2. The row decoder 140 may activate one of a plurality of word lines WL based on the second address ADDR2. The row decoder 140 may activate one of a plurality of word lines WL in response to the second address ADDR2.

The bit line driver 160 may be connected to the racetrack array 150 through a plurality of bit lines BL and connected to the current source circuit 110. The bit line driver 160 may receive the first address ADDR1 and the third address ADDR3, which are output from the address decoder 130. The bit line driver 160 may select at least one of the bit lines BL based on the third address ADDR3. The bit line driver 160 may shift the domains of the racetrack array 150 based on the first address ADDR1. The bit line driver 160 may select at least one of the bit lines BL in response to the third address ADDR3. The bit line driver 160 may shift the domains of the racetrack array 150 in response to the first address ADDR1.

The source line driver 170 may operate under control by the control logic 120. The source line driver 170 may apply a voltage and/or a current to at least one racetrack array 150 connected to a plurality of source lines SL.

The sense amplifier 180 may operate under control by the control logic 120. The sense amplifier 180 may sense a current and/or voltage flowing through the source lines SL and read or write data. The sense amplifier 180 may output read data or write data to the data buffer 190.

The data buffer 190 may operate under control by the control logic 120. The data buffer 190 may transmit data from the outside to the source line driver 170 or receive data from the sense amplifier 180. The racetrack array 150 is described in detail below with reference to FIG. 2.

Figure 2:
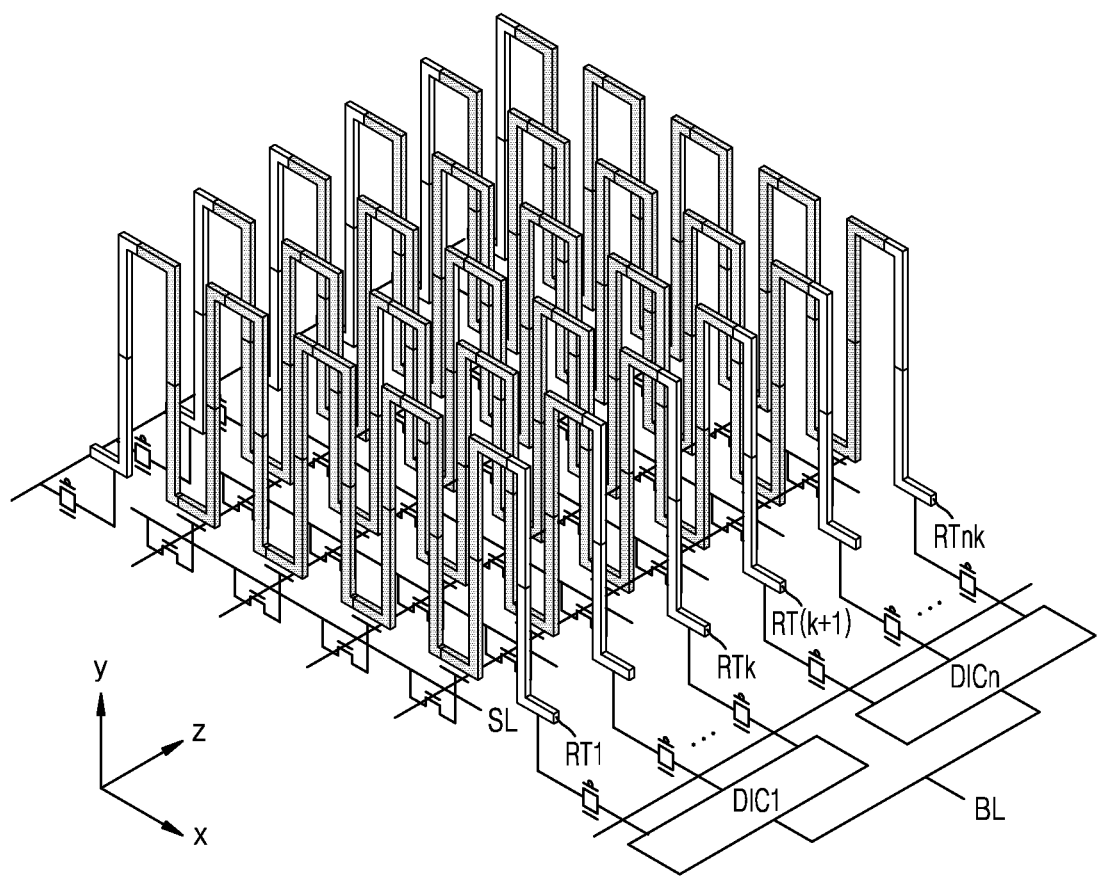
FIG. 2 is a structural diagram of a racetrack array according to an embodiment.

FIG. 2 is a structural diagram of a racetrack array according to an embodiment.

Referring to FIG. 2, the racetrack array may include a plurality of domain index controllers (e.g., DIC1~DICn) and a plurality of racetracks (e.g., RT1 to RTnk).

The domain index controllers may include first to n-th domain index controllers DIC1 to DICn. Here, "n" is a natural number that is greater than 1. First ends of the respective first to n-th domain index controllers DIC1 to DICn may be connected to at least one bit line BL, and second ends of the first to n-th domain index controllers DIC1 to DICn may be respectively connected to the racetracks (e.g., RT1 to RTnk). The first to n-th domain index controllers DIC1 to DICn may shift domains of the racetracks (e.g., RT1 to RTnk) connected to the second ends of the first to n-th domain index controllers DIC1 to DICn. The first to n-th domain index controllers DIC1 to DICn may store positions of domains to be shifted. The first to n-th domain index controllers DIC1 to DICn may receive the first address ADDR1 and the third address ADDR3. The first to n-th domain index controllers DIC1 to DICn may shift the domains of the racetracks (e.g., RT1 to RTnk), based on the first address ADDR1. At least one of the first to n-th domain index controllers DIC1 to DICn may be enabled based on the third address ADDR3. At least one of the first to n-th domain index controllers DIC1 to DICn may be enabled in response to the third address ADDR3.

The racetracks (e.g., RT1 to RTnk) may include first to k-th racetracks RT1 to RTk and (k+1)-th to nk-th racetracks RT(k+1) to RTnk. Here, "k" may be a natural number that is greater than 1 and equal to or different from "n". Each racetrack may be formed in a first direction (the x direction), and domains may be stacked in a second direction (the y direction) that is perpendicular to the first direction (the x direction). The first to nk-th racetracks RT1 to RTnk may be arranged in a third direction (the z direction) that is perpendicular to the first direction (the x direction). In other words, each of the first to nk-th racetracks RT1 to RTnk may be formed in the first direction (the x direction), and the first to nk-th racetracks RT1 to RTnk may be apart from each other in the third direction (the z direction).

Each of the first to nk-th racetracks RT1 to RTnk may be connected to one of the first to n-th domain index controllers DIC1 to DICn. For example, as shown in FIG. 2, the first to k-th racetracks RT1 to RTk may be connected to the first domain index controller DIC1, and the (k+1)-th to nk-th racetracks RTk+1 to RTnk may be connected to the n-th domain index controller DICn.

The first domain index controller DIC1 may include an n-bit register, and the first racetrack RT1 may include $2^n$ domains. For example, when the first domain index controller DIC1 includes a 3-bit register, the first racetrack RT1 may include eight domains.

In other words, a plurality of racetracks connected to each of the first to n-th domain index controllers DIC1 to DICn may be managed, and accordingly, a domain shift time may be reduced, and a read or write operation may be performed on the racetracks.

Figure 3:
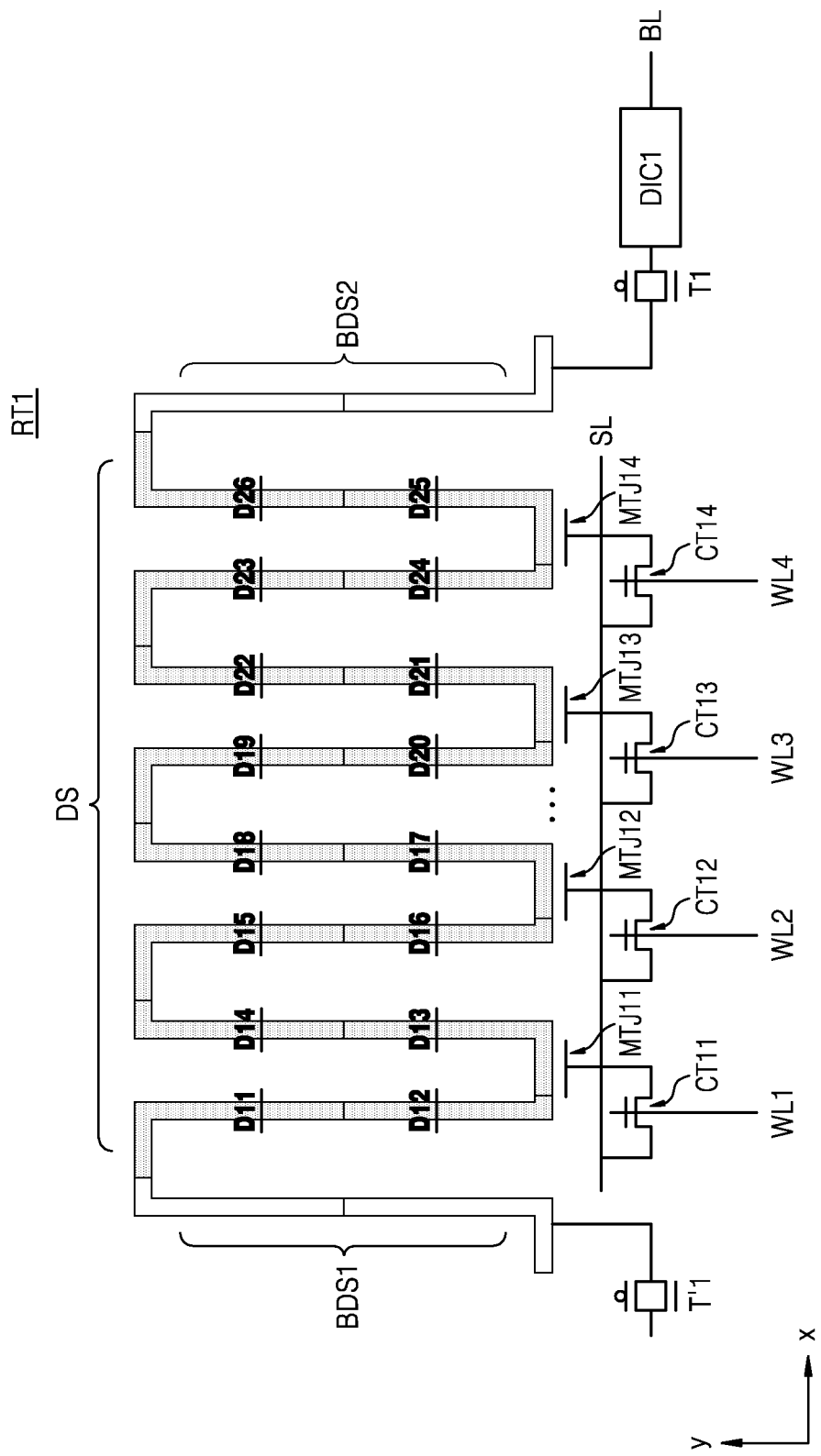
FIG. 3 is a diagram illustrating a portion of a racetrack array according to an embodiment.

FIG. 3 is a diagram illustrating a portion of a racetrack array according to an embodiment.

Referring to FIG. 3, a racetrack of the racetrack array is illustrated in two dimensions, for convenience of description. The first racetrack RT1 may be formed in the first direction (the x direction). The first racetrack RT1 may include a series of domains. The first racetrack RT1 may include a first buffer domain section BDS1, a domain section DS, and a second buffer domain section BDS2. Each of the first buffer domain section BDS1, the domain section DS, and the second buffer domain section BDS2 may include a series of domains. The domain section DS may be between the first buffer domain section BDS1 and the second buffer domain section BDS2.

Each of the first buffer domain section BDS1 and the second buffer domain section BDS2 may include a plurality of domains. The domain section DS may include a plurality of domains. For example, the domain section DS may include first to sixteenth domains D11 to D26. The first to sixteenth domains D11 to D26 in the domain section DS may store data. The domains in the first buffer domain section BDS1 and the domains in the second buffer domain section BDS2 may also store data.

The domain section DS may include a first number of domains. The first buffer domain section BDS1 may include a second number of domains. The second buffer domain section BDS2 may include a third number of domains. The first number may be greater than the second number or the third number. The second number or the third number may be half the first number. The second number or the third number may vary with the first number.

The domain section DS may include $2^n$ domains, the first buffer domain section BDS1 may include $2^{n-1}$ domains, and the second buffer domain section BDS2 may include $2^{n-1}-1$ domains. For example, the domain section DS may include eight domains, the first buffer domain section BDS1 may include four domains, and the second buffer domain section BDS2 may include three domains. However, the disclosure is not limited thereto, and as such, the number of domains in domain section DS the first buffer domain section BDS1 and the second buffer domain section BDS2 may be different according to another embodiment. Opposite ends of the first racetrack RT1 in the first direction (the x direction) may be respectively connected to first transistors T1 and T'1. For example, a first end of the first racetrack RT1 may be connected to a transistor T1 and a second end of the first racetrack RT1 may be connected to a transistor T'1. The first racetrack RT1 may be adjacent to first to fourth magnetic tunnel junction (MTJ) elements MTJ11 to MTJ14 and first to fourth cell transistors CT11 to CT14. The first to fourth MTJ elements MTJ11 to MTJ14 and the first to fourth cell transistors CT11 to CT14 may be adjacent to the domain section DS.

For example, the domain section DS of the first racetrack RT1 may be adjacent to the first MTJ element MTJ11 and the first cell transistor CT11. The first MTJ element MTJ11 may be adjacent to the third domain D13. A gate of the first cell transistor CT11 may be connected to a first word line WL1 among a plurality of word lines. A first end of the first cell transistor CT11 may be connected to the first MTJ element MTJ11, and a second end (e.g., an opposite end) of the first cell transistor CT11 may be connected to a source line SL. The second MTJ element MTJ12 may be adjacent to the seventh domain D17. A gate of the second cell transistor CT12 may be connected to a second word line WL2 among the word lines. A first end of the second cell transistor CT12 may be connected to the second MTJ element MTJ12, and a second end (e.g., an opposite end) of the second cell transistor CT12 may be connected to the source line SL. The third MTJ element MTJ13 may be adjacent to the eleventh domain D21. A gate of the third cell transistor CT13 may be connected to a third word line WL3 among the word lines. A first end of the third cell transistor CT13 may be connected to the third MTJ element MTJ13, and a second end (e.g., an opposite end) of the third cell transistor CT13 may be connected to the source line SL. The fourth MTJ element MTJ14 may be adjacent to the fifteenth domain D25. A gate of the fourth cell transistor CT14 may be connected to a fourth word line WL4 among the word lines. A first end of the fourth cell transistor CT14 may be connected to the fourth MTJ element MTJ14, and a second end (e.g., an opposite end) of the fourth cell transistor CT14 may be connected to the source line SL. A word line connected to the gate of each of the first to fourth cell transistors CT11 to CT14 may extend in the third direction (the z direction).

A first end of a series of domains of the first racetrack RT1 may be connected to the bit line BL, and a second end (e.g., an opposite end) of series of domains of the first racetrack RT1 may be connected to the first domain index controller DIC1.

For convenience of description, the structure of only the first racetrack RT1 is described. The second to nk-th racetracks RT2 to RTnk may have the same structure as the first racetrack RT1, and thus, descriptions thereof are omitted.

Figure 4A:
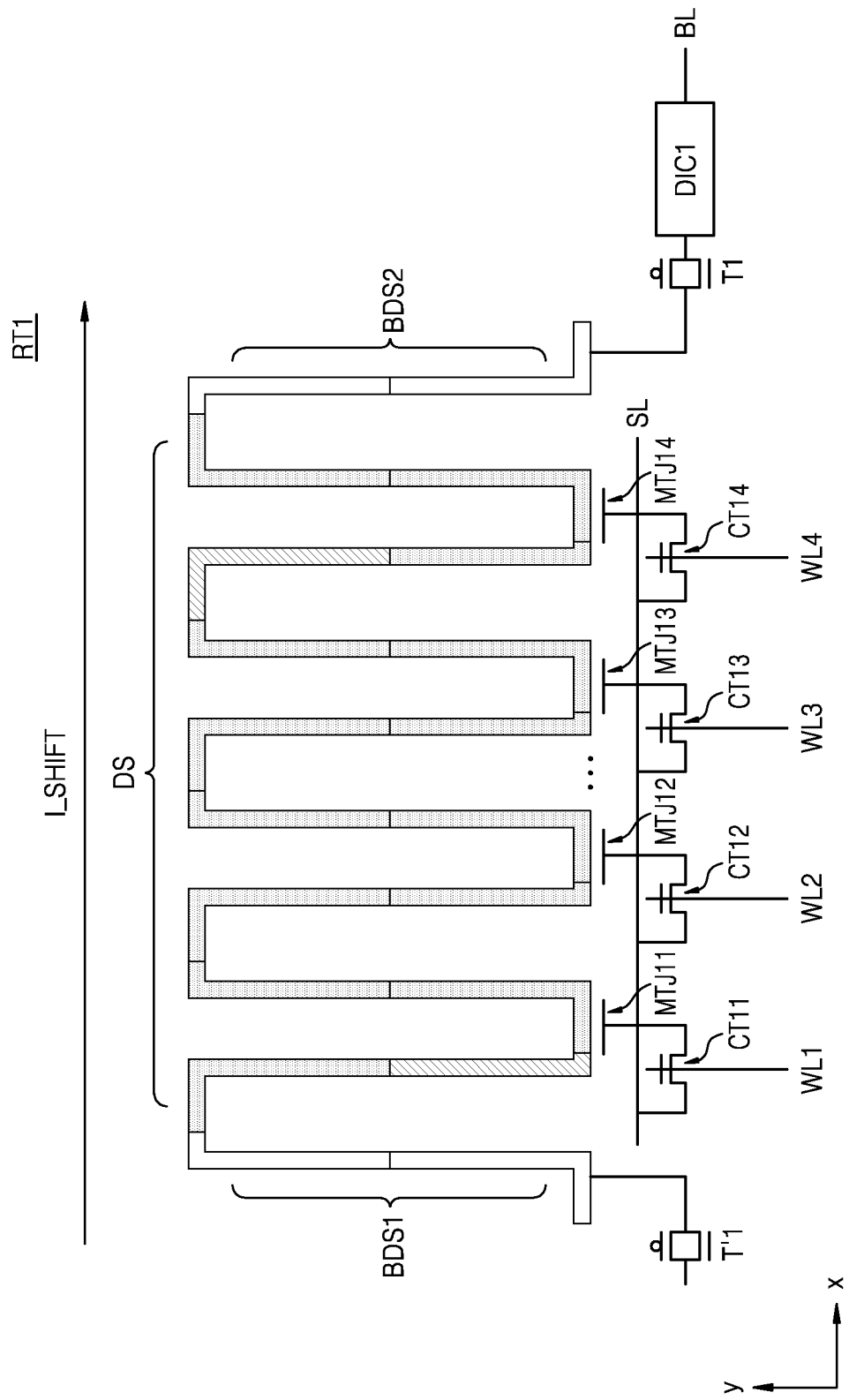
FIG. 4A is a diagram illustrating a racetrack before domain shift, according to an embodiment.
Figure 4B:
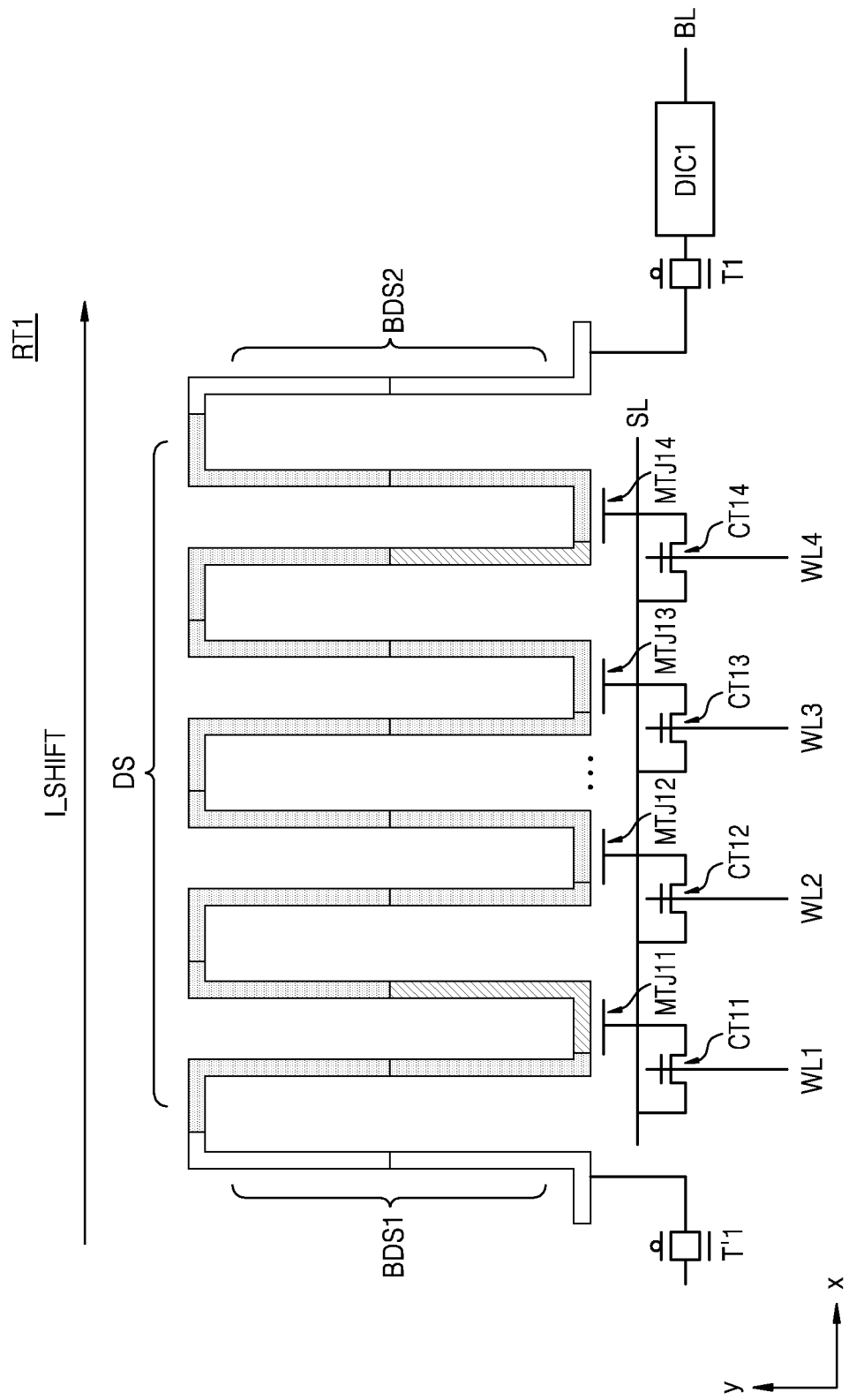
FIG. 4B is a diagram illustrating a racetrack after domain shift, according to an embodiment.
Figure 4C:
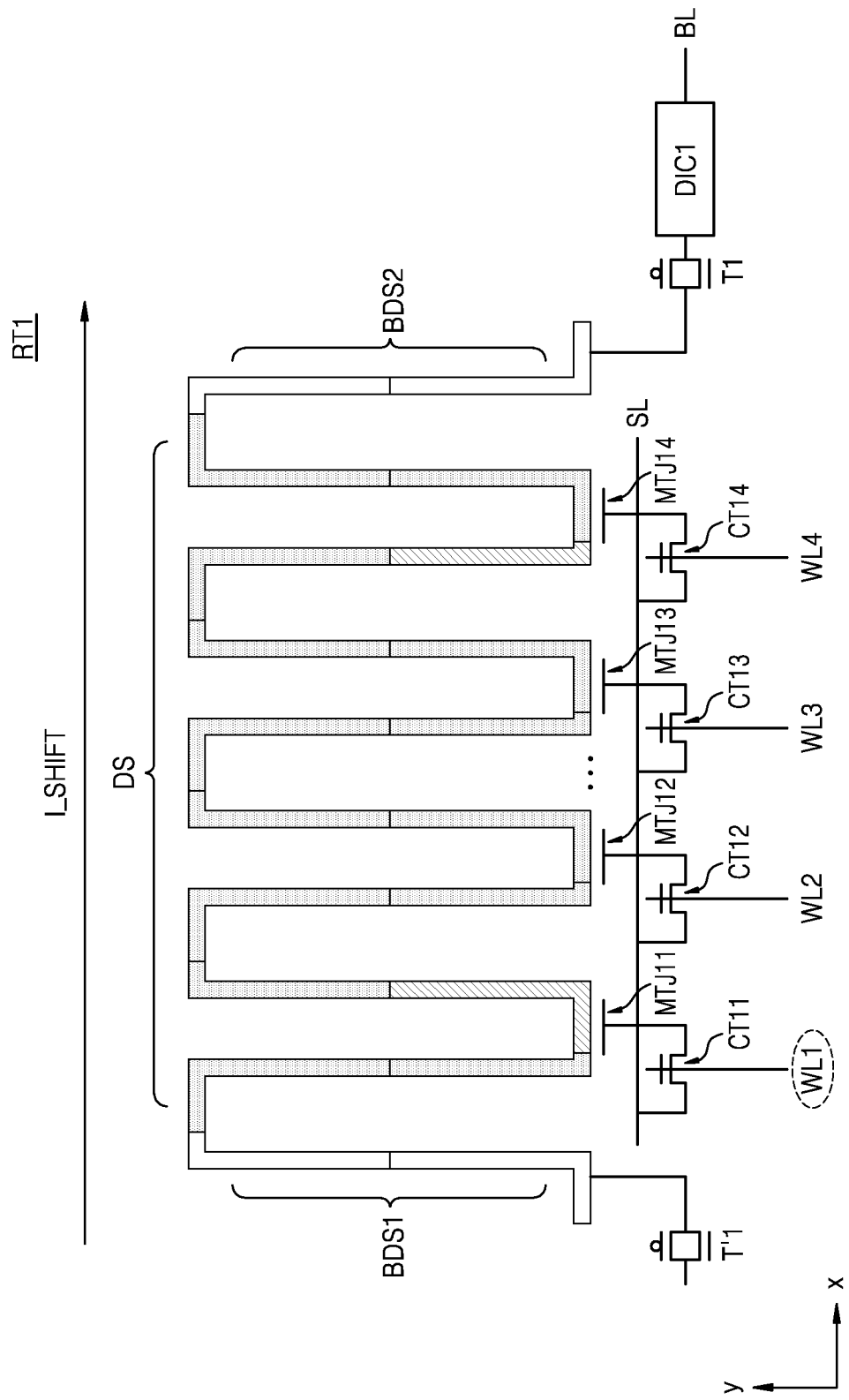
FIG. 4C is a diagram illustrating a racetrack when a word line is activated and a read or write operation is performed, according to an embodiment.

FIG. 4A is a diagram illustrating a racetrack before domain shift, according to an embodiment. FIG. 4B is a diagram illustrating a racetrack after domain shift, according to an embodiment. FIG. 4C is a diagram illustrating a racetrack when a word line is activated and a read or write operation is performed, according to an embodiment.

Referring to FIG. 4A, data has been stored in the domain section DS of the first racetrack RT1. Based on the first address ADDR1 (in FIG. 1), the first domain index controller DIC1 may shift a domain of the first racetrack RT1. Although the shift current I_SHIFT flows in the first direction (the x direction) in FIG. 4A, the disclosure is not limited thereto, and as such, according to another embodiment, the direction of the shift current I_SHIFT may flow in an opposite direction.

Referring to FIG. 4B, the data stored in the domain section DS of the first racetrack RT1 has shifted across domains. Based on the second address ADDR2 (in FIG. 1), the row decoder 140 (in FIG. 1) may enable at least one of the word lines WL (in FIG. 1). For example, during a first shift operation, the bit line driver may shift first data in a first domain D11 of the first racetrack RT1 to a second domain D12 of the first racetrack RT1, and shift second data from the second domain D12 of the first racetrack RT1 to a third domain D13 of the first racetrack RT1 and so forth. Subsequently, during a second shift operation the bit line driver may shift the first data from the second domain D12 to the third domain D13, and shift the second data from the third domain D13 to a fourth domain D14 and so forth.

For example, based on the second address ADDR2 (in FIG. 1), the row decoder 140 (in FIG. 1) may enable the first word line WL1. When the first word line WL1 is enabled, the first MTJ element MTJ11 adjacent to the first racetrack RT1 may be enabled. In other words, based on the second address ADDR2 (in FIG. 1), some of a plurality of MTJ elements adjacent to the first racetrack RT1 may be selected. Referring to FIG. 4C, the first word line WL1 may be enabled, and a read or write operation may be performed on the data stored in the first racetrack RT1. The read current I_READ (in FIG. 1) or the write current I_WRITE (in FIG. 1) may be less than the shift current I_SHIFT.

When one of a plurality of word lines is enabled, MTJ elements connected to the enabled word line among a plurality of MTJ elements adjacent to a plurality of racetracks (e.g., RT1 to RTnk) may be selected. For example, when the first word line WL1 is enabled, the first MTJ element MTJ11 among a plurality of MTJ elements adjacent to the first racetrack RT1 may be selected.

Referring to FIGS. 2 and 4A to 4C, because each of the one or more domain index controllers (e.g., DIC1 to DICn) control one or more racetracks (e.g., RT1 to RTnk), a domain shift time may be reduced, and a read or write operation may be performed on a plurality of racetracks at a time.

Figure 5:
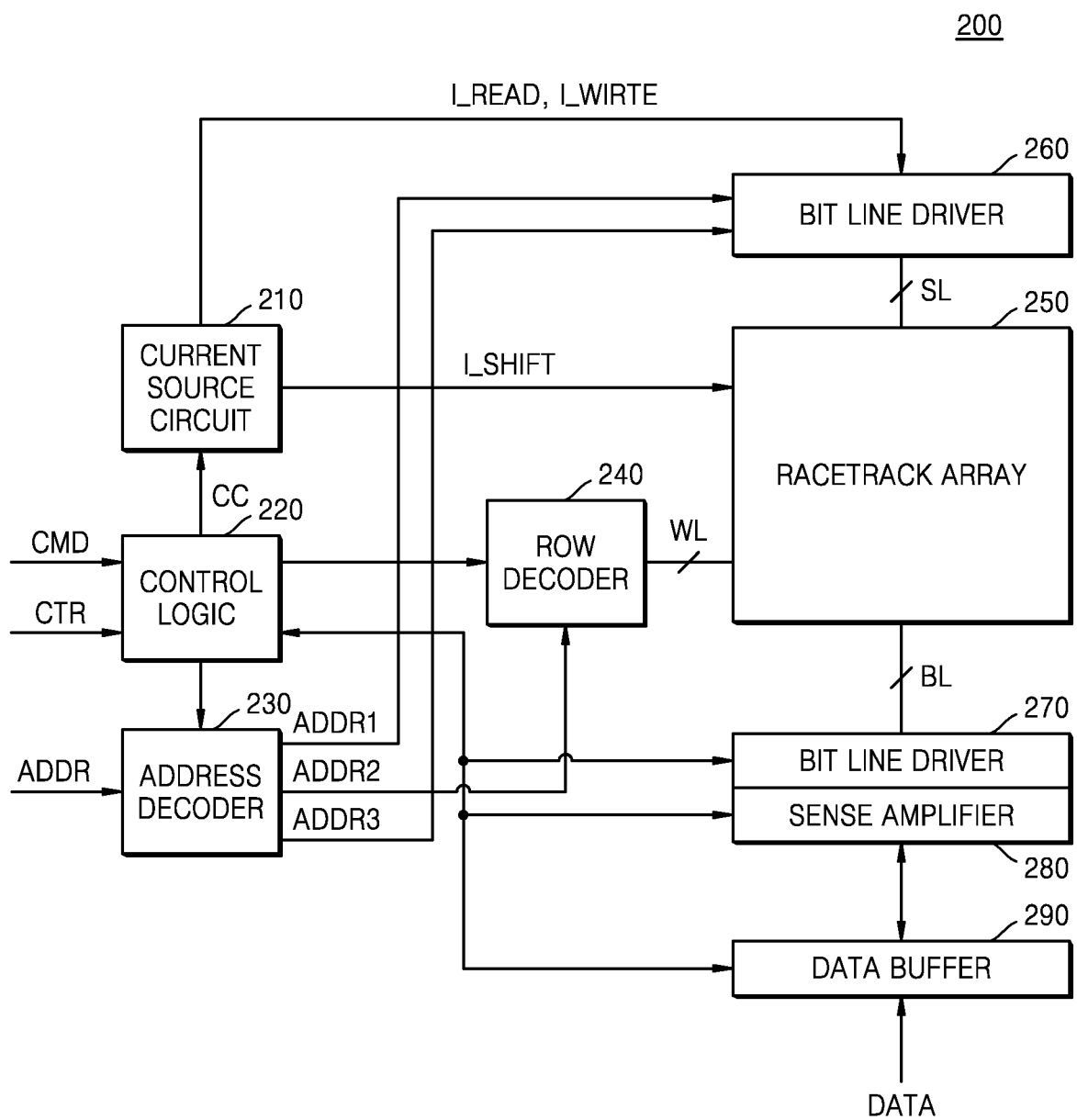
FIG. 5 is a block diagram of a memory device according to another embodiment.

FIG. 5 is a block diagram of a memory device according to another embodiment. Referring to FIG. 5, unlike FIG. 1, a bit line driver 270 may be connected to a sense amplifier 280. Redundant descriptions given above with reference to FIG. 1 are omitted below.

Referring to FIG. 5, a memory device 200 may include a current source circuit 210, a control logic 220, an address decoder 230, a row decoder 240, a racetrack array 250, a source line driver 260, the bit line driver 270, the sense amplifier 280, and a data buffer 290.

The current source circuit 210 may provide the read current I_READ or the write current I_WRITE to the source line driver 260. The current source circuit 210 may provide the shift current I_SHIFT to the racetrack array 250 to shift domains. The control logic 220 may transmit the current control command CC to the current source circuit 210 to control the magnitude of the shift current I_SHIFT provided from the current source circuit 210 to the racetrack array 250, the magnitudes of the read and write currents I_READ and I_WRITE provided from the current source circuit 210 to the source line driver 260, and the direction of the shift current I_SHIFT, the read current I_READ, or the write current I_WRITE.

The source line driver 260 may be connected to the racetrack array 250 through a plurality of source lines SL and connected to the current source circuit 210. The source line driver 260 may receive the first address ADDR1 and the third address ADDR3, which are output from the address decoder 230. The source line driver 260 may select at least one of the source lines SL in response to the third address ADDR3.

The bit line driver 270 may apply a voltage and/or a current to at least one racetrack array 250 connected to a plurality of bit lines BL.

The sense amplifier 280 may sense a current and/or voltage flowing through the bit lines BL and read or write data.

The data buffer 290 may transmit data from the outside of the memory device 200 to the bit line driver 270 or receive data from the sense amplifier 280. The racetrack array 250 is described in detail below with reference to FIG. 6.

Figure 6:
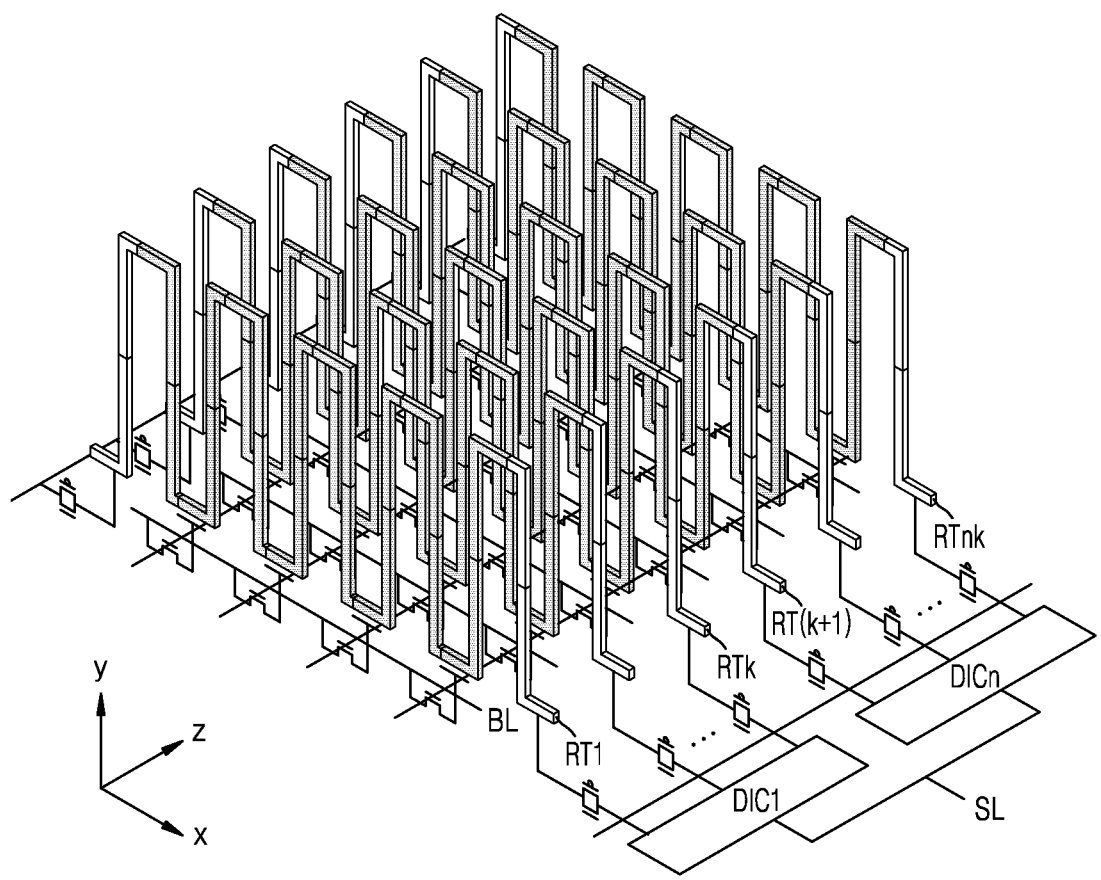
FIG. 6 is a structural diagram of a racetrack array according to another embodiment.

FIG. 6 is a structural diagram of a racetrack array according to another embodiment.

Referring to FIG. 6, unlike FIG. 2, the first to n-th domain index controllers DIC1 to DICn may be connected to a source line SL. Redundant descriptions given above with reference to FIG. 2 are omitted below.

Referring back to FIG. 6, first ends of the respective first to n-th domain index controllers DIC1 to DICn may be connected to the source line SL, and second ends of the first to n-th domain index controllers DIC1 to DICn may be respectively connected to the racetracks (e.g., RT1 to RTnk).

Figure 7:
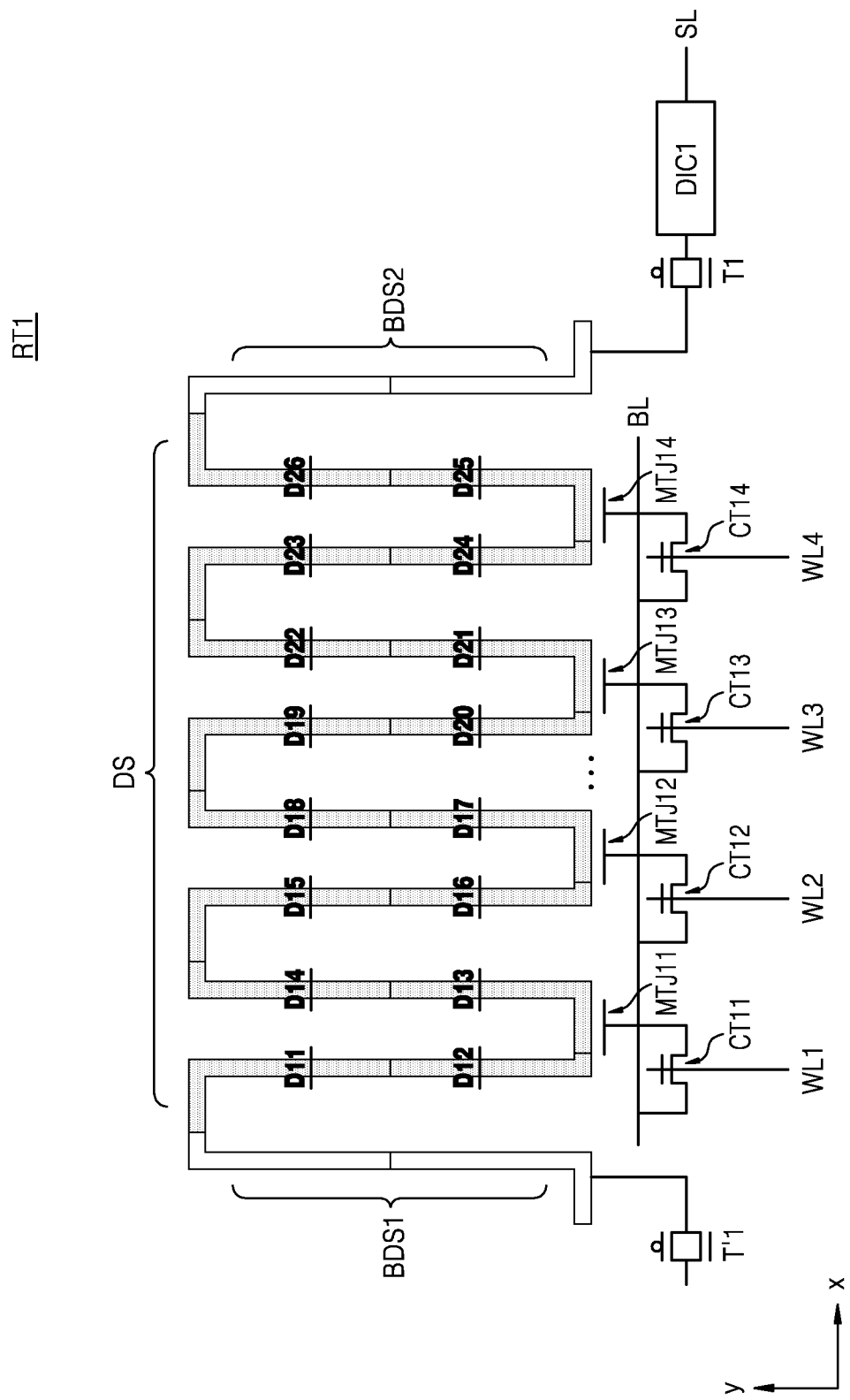
FIG. 7 is a diagram illustrating a portion of a racetrack array according to another embodiment.

FIG. 7 is a diagram illustrating a portion of a racetrack array according to another embodiment. Redundant descriptions given above with reference to FIG. 3 are omitted below.

Referring to FIG. 7, a racetrack RT1 may be formed in the first direction (the x direction). The racetrack RT1 may include a series of domains. The racetrack RT1 may include a first buffer domain section BDS1, a domain section DS, and a second buffer domain section BDS2. Each of the first buffer domain section BDS1, the domain section DS, and the second buffer domain section BDS2 may include a series of domains. The domain section DS may be between the first buffer domain section BDS1 and the second buffer domain section BDS2.

Each of the first buffer domain section BDS1 and the second buffer domain section BDS2 may include a plurality of domains. The domain section DS may include "m" domains, where "m" is a natural number that is greater than 1. For example, the domain section DS may include the first to sixteenth domains D11 to D26, as shown in FIG. 6. The first to sixteenth domains D11 to D26 in the domain section DS may store data. The first buffer domain section BDS1 and the second buffer domain section BDS2 may also store data.

The domain section DS may include 2n domains, the first buffer domain section BDS1 may include $2^{n-1}$ domains, and the second buffer domain section BDS2 may include $2^{n-1}-1$ domains. For example, the domain section DS may include eight domains, the first buffer domain section BDS1 may include four domains, and the second buffer domain section BDS2 may include three domains. Opposite ends of the first racetrack RT1 in the first direction (the x direction) may be respectively connected to first transistors T1 and T'1. The racetrack RT1 may be adjacent to first to fourth MTJ elements MTJ11 to MTJ14 and first to fourth cell transistors CT11 to CT14. The first to fourth MTJ elements MTJ11 to MTJ14 and the first to fourth cell transistors CT11 to CT14 may be adjacent to the domain section DS.

For example, the domain section DS of the racetrack RT1 may be adjacent to the first MTJ element MTJ11 and the first cell transistor CT11. The first MTJ element MTJ11 may be adjacent to the third domain D13. A gate of the first cell transistor CT11 may be connected to a first word line WL1 among a plurality of word lines. An end of the first cell transistor CT11 may be connected to the first MTJ element MTJ11, and an opposite end thereof may be connected to a bit line BL. The second MTJ element MTJ12 may be adjacent to the seventh domain D17. A gate of the second cell transistor CT12 may be connected to a second word line WL2 among the word lines. An end of the second cell transistor CT12 may be connected to the second MTJ element MTJ12, and an opposite end thereof may be connected to the bit line BL. The third MTJ element MTJ13 may be adjacent to the eleventh domain D21. A gate of the third cell transistor CT13 may be connected to a third word line WL3 among the word lines. An end of the third cell transistor CT13 may be connected to the third MTJ element MTJ13, and an opposite end thereof may be connected to the bit line BL. The fourth MTJ element MTJ14 may be adjacent to the fifteenth domain D25. A gate of the fourth cell transistor CT14 may be connected to a fourth word line WL4 among the word lines. An end of the fourth cell transistor CT14 may be connected to the fourth MTJ element MTJ14, and an opposite end thereof may be connected to the bit line BL.

For example, the domain section DS of the racetrack RT1 may be adjacent to the first to fourth MTJ elements MTJ11 to MTJ14 and the first to fourth cell transistors CT11 to CT14. An end of a series of domains of the racetrack RT1 may be connected to the source line SL, and an opposite end thereof may be connected to a domain index controller DIC1.

Because the racetrack RT1 is adjacent to the first to fourth MTJ elements MTJ11 to MTJ14 and the first to fourth cell transistors CT11 to CT14, a domain shift time and the number of domain shifts may be reduced. In addition, because the racetrack RT1 is adjacent to the first to fourth MTJ elements MTJ11 to MTJ14 and the first to fourth cell transistors CT11 to CT14, the number of domains included in each of the first buffer domain section BDS1 and the second buffer domain section BDS2 may be reduced, and accordingly, the size of a memory device may be reduced.

In other words, because a plurality of MTJ elements and a plurality of cell transistors are adjacent to the domain section DS, a domain shift time and the number of domain shifts may be reduced, and the number of domains included in each of the first buffer domain section BDS1 and the second buffer domain section BDS2 may be reduced. Accordingly, the size of a memory device may also be reduced.

Figure 8A:
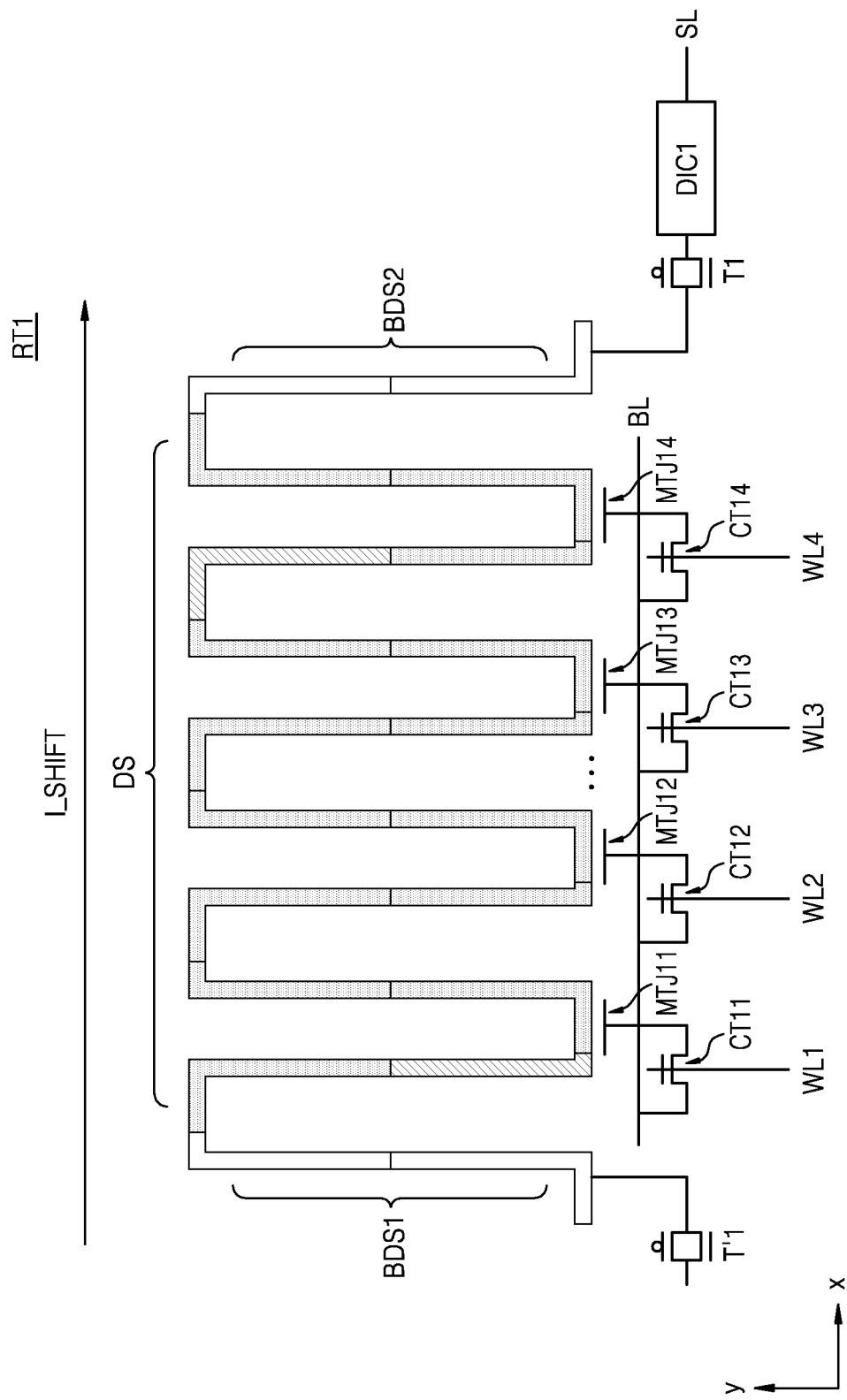
FIG. 8A is a diagram illustrating a racetrack before domain shift, according to another embodiment.
Figure 8B:
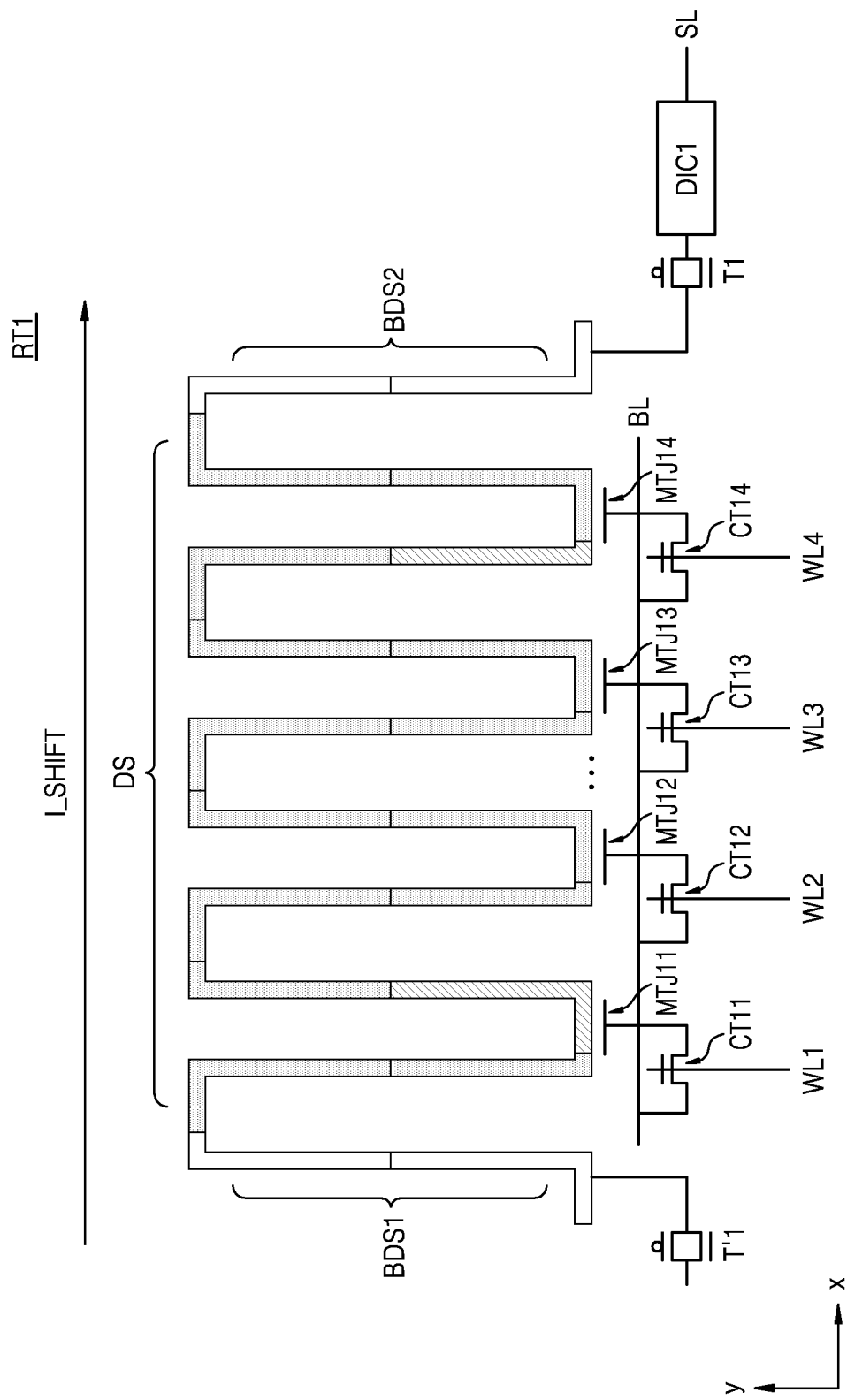
FIG. 8B is a diagram illustrating a racetrack after domain shift, according to another embodiment.

FIG. 8A is a diagram illustrating a racetrack before domain shift, according to another embodiment. FIG. 8B is a diagram illustrating a racetrack after domain shift, according to another embodiment. FIG. 8C is a diagram illustrating a racetrack when a word line is activated and a read or write operation is performed, according to another embodiment.

Referring to FIG. 8A, data has been stored in the domain section DS of the racetrack RT1. Based on the first address ADDR1 (in FIG. 5), the domain index controller DIC1 may shift a domain of the racetrack RT1. Although the shift current I_SHIFT flows in the first direction (the x direction) in FIG. 8A, the direction of the shift current I_SHIFT may flow in an opposite direction.

Referring to FIG. 8B, the data stored in the domain section DS of the racetrack RT1 has shifted across domains. Based on the second address ADDR2 (in FIG. 5), the row decoder 240 (in FIG. 5) may enable at least one of the word lines WL (in FIG. 5).

For example, based on the second address ADDR2 (in FIG. 5), the row decoder 240 (in FIG. 5) may enable the first word line WL1. When the first word line WL1 is enabled, the first MTJ element MTJ11 adjacent to the racetrack RT1 may be enabled. In other words, based on the second address ADDR2 (in FIG. 5), some of a plurality of MTJ elements adjacent to the racetrack RT1 may be selected. Referring to FIG. 8C, the first word line WL1 may be enabled, and a read or write operation may be performed on the data stored in the racetrack RT1. The read current I_READ (in FIG. 5) or the write current I_WRITE (in FIG. 5) may be less than the shift current I_SHIFT.

When one of a plurality of word lines is enabled, MTJ elements connected to the enabled word line among a plurality of MTJ elements adjacent to a plurality of racetracks (e.g., RT1 to RTnk) may be selected. For example, when the first word line WL1 is enabled, the first MTJ element MTJ11 among a plurality of MTJ elements adjacent to the first racetrack RT1 may be selected.

Referring to FIGS. 6 and 8A to 8C, because one or more domain index controllers (e.g., DIC1 to DICn) control one or more racetracks (e.g., RT1 to RTnk), a domain shift time may be reduced, and a read or write operation may be performed on a plurality of racetracks at a time.

Figure 9:
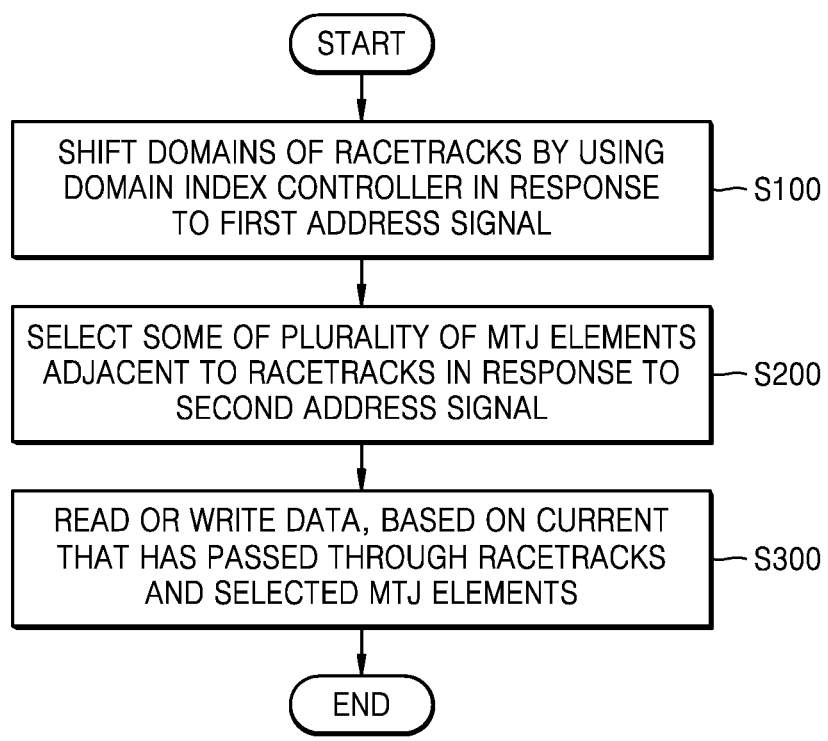
FIG. 9 is a flowchart of an operating method of a memory device, according to an embodiment.

FIG. 9 is a flowchart of an operating method of a memory device, according to an embodiment.

Referring to FIG. 9, in operation S100, a bit line driver may shift domains of a plurality of racetracks by using a domain index controller based on a first address signal. For example, the bit line driver may shift domains of a plurality of racetracks by using a domain index controller in response to a first address signal. According to an embodiment, shifting the domains of a plurality of racetracks may be shifting data across the plurality of domains. For example, during a first shift operation, the bit line driver may shift first data in a first domain of a plurality of first racetracks to a second domain of the plurality of first racetracks, and shift second data from the second domain of the plurality of first racetracks to a third domain of the plurality of first racetracks and so forth. Subsequently, during a second shift operation the bit line driver may shift the first data from the second domain to the third domain, and shift the second data from the third domain to a fourth domain and so forth.

For example, referring to FIG. 5, the source line driver 260 may allow the first domain index controller DIC1 to shift the domains of the first racetrack RT1 and the second racetrack RT2, based on the first address ADDR1. The shifting of the domains of the racetracks may include providing the shift current I_SHIFT to the racetracks.

A row decoder may select some of a plurality of MTJ elements, which are adjacent to the racetracks, in response to a second address signal in operation S200.

For example, referring to FIG. 5, the row decoder 240 may enable the first word line WL1 among a plurality of word lines, based on the second address ADDR2. When the first word line WL1 is enabled, the first MTJ element MTJ11 among a plurality of MTJ elements adjacent to the first racetrack RT1 may be selected. The selecting of some of the MTJ elements may include selecting one of a series of MTJ elements adjacent to each of the racetracks.

A sense amplifier may read or write data, based on current that has passed through the racetracks and the selected MTJ elements, in operation S300.

For example, referring to FIG. 5, when the first word line WL1 is enabled, the sense amplifier 280 may allow the first MTJ element MTJ11, which is adjacent to the first racetrack RT1, to read or write data based on the read current I_READ or the write current I_WRITE. The reading or writing of the data may include providing the racetracks with a read or write current that is less than the shift current I_SHIFT.

Figure 10:
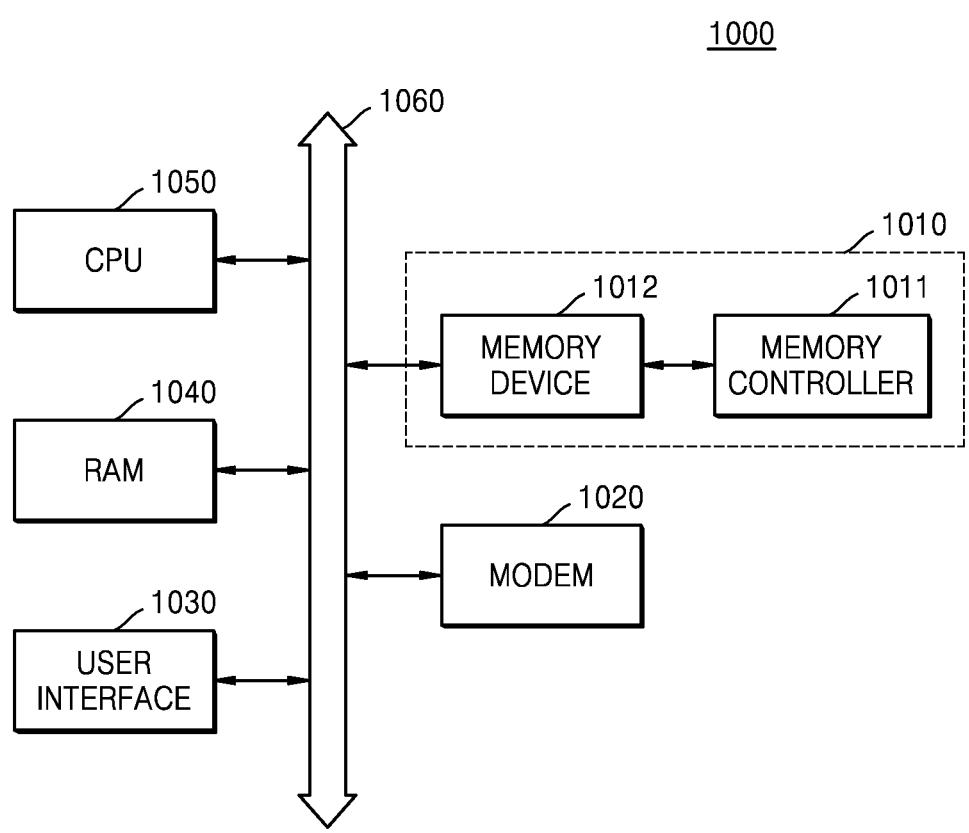
FIG. 10 is a diagram illustrating a computing system including a memory device, according to an embodiment.

FIG. 10 is a diagram illustrating a computing system including a memory device, according to an embodiment.

Referring to FIG. 10, a computing system 1000 may include a memory system 1010, a modem 1020, a user interface 1030, random access memory (RAM) 1040, and a central processing unit (CPU) 1050. The memory system 1010 include a memory device 1012 and a memory controller may be mounted on the computing system 1000. The memory device 1012 may correspond to a magnetoresistive RAM (MRAM) chip including a spin transfer torque (STT)-MRAM cell. The memory system 1010 may correspond to an MRAM system including an MRAM chip. It is apparent to one of ordinary skill in the art that the computing system 1000 may further include an application chipset, a camera image processor (CIS), an input/output device, and/or the like.

According to an embodiment, the computing system 1000 may correspond to a desktop computer, a server computer, a notebook computer, a tablet computer, a smartphone, or a wearable device but is not limited thereto.

In an embodiment, the memory system 1010 may include a memory controller 1011 and the memory device 1012. Data processed by the CPU 1050 or data received from the outside of the computing system 1000 may be stored in the memory device 1012. At this time, the memory device 1012 may be implemented as illustrated in the embodiments described above with reference to FIGS. 1 to 9. For example, the memory device 1012 may include a racetrack array having a series of domains. The racetrack may include a first buffer domain section, a domain section, and a second buffer domain section. An end of the series of domains of the racetrack may be connected to a bit line, and an opposite end thereof may be connected to a domain index controller.

According to an embodiment, at least one domain index controller controls at least one three-dimensional (3D) racetrack, and as such, a domain shift time may be reduced. Moreover, the domain index controller may control the memory device 1012, such that an operating time and power consumption of the memory device 1012 may be reduced.

While the inventive concept has been particularly shown and described with reference to embodiments thereof, it will be understood that various changes in form and details may be made therein without departing from the spirit and scope of the following claims.

What is claimed is:

1. A memory device comprising:
   a first racetrack formed in a first direction, the first racetrack comprising a domain section comprising a plurality of first domains arranged in a second direction that is perpendicular to the first direction;
   a first transistor connected to the first racetrack;
   a first domain index controller connected to the first transistor and configured to shift first data from a first domain to a second domain, among the plurality of first domains of the first racetrack;
   a bit line driver connected to the first domain index controller;
   a plurality of first magnetic tunnel junction (MTJ) elements arranged in the first direction and adjacent to the first racetrack;
   a plurality of first cell transistors respectively connected to the plurality of first MTJ elements; and
   a source line driver connected to the plurality of first cell transistors through a source line.

2. The memory device of claim 1, wherein the first racetrack further comprises a first buffer domain section and a second buffer domain section, and
   wherein the domain section is between the first buffer domain section and the second buffer domain section.

3. The memory device of claim 2, wherein a first number of the plurality of first domains in the domain section is greater than a second number of domains in the first buffer domain section and a third number of domains in the second buffer domain section.

4. The memory device of claim 2, wherein the bit line driver is connected to the first buffer domain section of the first racetrack.

5. The memory device of claim 1, further comprising a row decoder configured to drive a plurality of word lines,
   wherein each of the plurality of first cell transistors is connected to one of the plurality of word lines.

6. The memory device of claim 5, wherein the first domain index controller is further configured to shift the first data from the first domain to the second domain of the first racetrack in the first direction, based on a first address, and
   wherein the row decoder is further configured to activate one of the plurality of word lines, based on a second address.

7. The memory device of claim 1, wherein the first domain index controller is enabled based on a third address.

8. The memory device of claim 1, wherein the first domain index controller comprises an n-bit register, and
   wherein the domain section comprises $2^n$ domains.

9. The memory device of claim 1, further comprising:
   a second racetrack spaced apart from the first racetrack in a third direction perpendicular to the first direction and the second direction, the second racetrack comprising a plurality of second domains;
   a second transistor connected to the second racetrack;
   a second domain index controller connected to the second transistor and configured to shift second data from a first domain to a second domain, among the plurality of second domains of the second racetrack;
   a plurality of second MTJ elements arranged in the first direction and adjacent to the second racetrack; and
   a plurality of second cell transistors respectively connected to the plurality of second MTJ elements,
   wherein the bit line driver is connected to the second domain index controller, and the source line driver is connected to respective ends of the plurality of second cell transistors through the source line.

10. A memory device comprising:
    a racetrack formed in a first direction, the racetrack comprising a domain section comprising a plurality of domains arranged in a second direction that is perpendicular to the first direction;
    a first transistor connected to the racetrack;
    a domain index controller connected to the first transistor and configured to shift first data from a first domain to a second domain, among the plurality of domains of the racetrack;

a source line driver connected to the domain index controller;

a plurality of magnetic tunnel junction (MTJ) elements arranged in the first direction and adjacent to the racetrack;

a plurality of cell transistors respectively connected to the plurality of MTJ elements; and a bit line driver connected to the plurality of cell transistors through a bit line.

11. The memory device of claim 10, wherein the racetrack further comprises a first buffer domain section and a second buffer domain section, and wherein the domain section is between the first buffer domain section and the second buffer domain section.

12. The memory device of claim 11, wherein a first number of the plurality of first domains in the domain section is greater than a second number of domains in the first buffer domain section and a third number of domains in the second buffer domain section.

13. The memory device of claim 11, wherein the bit line driver is connected to the first buffer domain section of the racetrack.

14. The memory device of claim 10, further comprising a row decoder configured to drive a plurality of word lines, wherein each of the plurality of cell transistors is connected to one of the plurality of word lines.

15. The memory device of claim 14, wherein the domain index controller is further configured to shift the first data from the first domain to the second domain of the racetrack in the first direction, based on a first address, and wherein the row decoder is further configured to activate one of the plurality of word lines, based on a second address.

16. The memory device of claim 14, wherein the domain index controller is enabled based on a third address.

17. The memory device of claim 10, wherein the domain index controller comprises an n-bit register, and wherein the domain section comprises $2^n$ domains.

18. An operating method of a memory device, the operating method comprising:

shifting first data from a first domain to a second domain, among a plurality of domains in a racetrack, based on a first address signal;

selecting one of a plurality of magnetic tunnel junction (MTJ) elements adjacent to the racetrack, based on a second address signal; and performing a read operation or a write operation based on a current that has passed through the racetrack and the selected MTJ elements.

19. The operating method of claim 18, wherein the shifting of the first data from the first domain to the second domain of the racetrack comprises providing a first current to the racetrack.

20. The operating method of claim 19, wherein the performing the read operation or the write operation comprises providing the racetrack with a second current that is less than the first current.

* * * * *